April 21, 1964 J. F. McMAHON, JR., ETAL 3,130,031

APPARATUS FOR FABRICATING SEMICONDUCTOR DEVICES

Filed May 4, 1959 7 Sheets-Sheet 1

INVENTORS
JOHN F. McMAHON JR.
JOSEPH HAROLD MICHEL

BY Carl H. Symmestvedt

April 21, 1964 J. F. McMAHON, JR., ETAL 3,130,031

APPARATUS FOR FABRICATING SEMICONDUCTOR DEVICES

Filed May 4, 1959 7 Sheets-Sheet 2

INVENTORS
JOHN F. McMAHON JR.
JOSEPH HAROLD MICHEL
BY

Carl H. Lynnedwell

APPARATUS FOR FABRICATING SEMICONDUCTOR DEVICES

Filed May 4, 1959 7 Sheets-Sheet 3

INVENTORS
JOHN F. McMAHON JR.
JOSEPH HAROLD MICHEL
BY
Carl H. Symmestvedt

APPARATUS FOR FABRICATING SEMICONDUCTOR DEVICES

Filed May 4, 1959 7 Sheets-Sheet 4

INVENTORS
JOHN F. McMAHON JR.
JOSEPH HAROLD MICHEL
BY
Carl H. Synnestvedt

APPARATUS FOR FABRICATING SEMICONDUCTOR DEVICES

Filed May 4, 1959 7 Sheets-Sheet 5

INVENTORS
JOHN F. McMAHON JR.
JOSEPH HAROLD MICHEL
BY
Carl H. Synnestvedt

APPARATUS FOR FABRICATING SEMICONDUCTOR DEVICES

Filed May 4, 1959 7 Sheets-Sheet 6

INVENTORS
JOHN F. McMAHON JR.
JOSEPH HAROLD MICHEL
BY
Carl H. Sy[illegible]

INVENTORS
JOHN F. McMAHON JR.
JOSEPH HAROLD MICHEL
BY
Carl H. Symmedwed

United States Patent Office 3,130,031
Patented Apr. 21, 1964

3,130,031

APPARATUS FOR FABRICATING SEMI-CONDUCTOR DEVICES

John F. McMahon, Jr., Lansdale, and Joseph Harold Michel, Southampton, Pa., assignors, by mesne assignments, to Philco Corporation, Philadelphia, Pa., a corporation of Delaware
Filed May 4, 1959, Ser. No. 810,939
2 Claims. (Cl. 65—155)

This invention relates generally to improvements in the art of manufacturing encapsulating structures and more particularly to unique apparatus for fabricating hermetic closures.

While of broader applicability this invention has found particularly advantageous use in the fabrication of stem closures of the type typically employed in the hermetic encapsulation of transistors and other semiconductor devices, and it is with respect to this particular field of application that the invention is illustrated and described.

Insofar as semiconductor devices are moisture sensitive to a considerable degree, it is desirable that means be developed for producing inexpensive hermetic seals having particular application to such devices. Encapsulating means currently in use include a single ended, cup-shaped, metal envelope, which partially encloses the semiconductor device leaving one end open. The opening is subsequently sealed by a suitable closure, as for example a stem assembly comprising an insulating core or matrix of vitreous, ceramic or other suitable material. This insulating core or matrix has extending therethrough and hermetically sealed therein the lead-in wires which provide electrical accessibility to the encapsulated portions of the electrical system.

Stem assemblies, as for example those used in conjunction wtih semiconductor devices, such as transistors, commonly include an additional element in the form of a metallic eyelet, which surrounds and is hermetically sealed to the glass core or bead, and which facilitates juncture of the stem assembly with the aforementioned metal envelope.

Stem assemblies of this nature require a precise volume of glass, or other insulating material for disposition within the eyelet housing, this requirement being particularly acute in the semiconductor field because of the exceedingly small sizes involved. Moreover, the maintenance of precise lead orientation during fabrication and sealing presents difficulties because of the inherently close tolerance requirements. Lead-in wires not only serve the function of providing electrical accessibility to the enclosed or encapsulated elements of a system, but in addition often serve in the capacity of contact probes for insertion into standardized sockets.

Because of the small size of semiconductor devices and the high degree of accuracy required in their assembly the practice with regard to their manufacture has in large part been one of hand assembly, a procedure which is both time consuming and costly. Moreover, this method of manufacture has proven impracticable in meeting the insatiable demand created by the extensive and expanding use of semiconductor devices in an ever widening spectrum of critical applications.

Accordingly, it is an object of this invention to provide apparatus for fully mechanizing the production of closure devices.

It is another object of this invention to provide a simplified method of mass producing hermetic closures so as to produce a uniform product at minimal cost and one which obviates the limitations of prior art techniques.

It is a still further and more particularized object of the present invention to provide automatic machinery for high speed production of transistor stem assemblies.

These and other objects within contemplation will be apparent by reference to the accompanying detailed description and drawings, in which.

Figures 1, 2, 21:
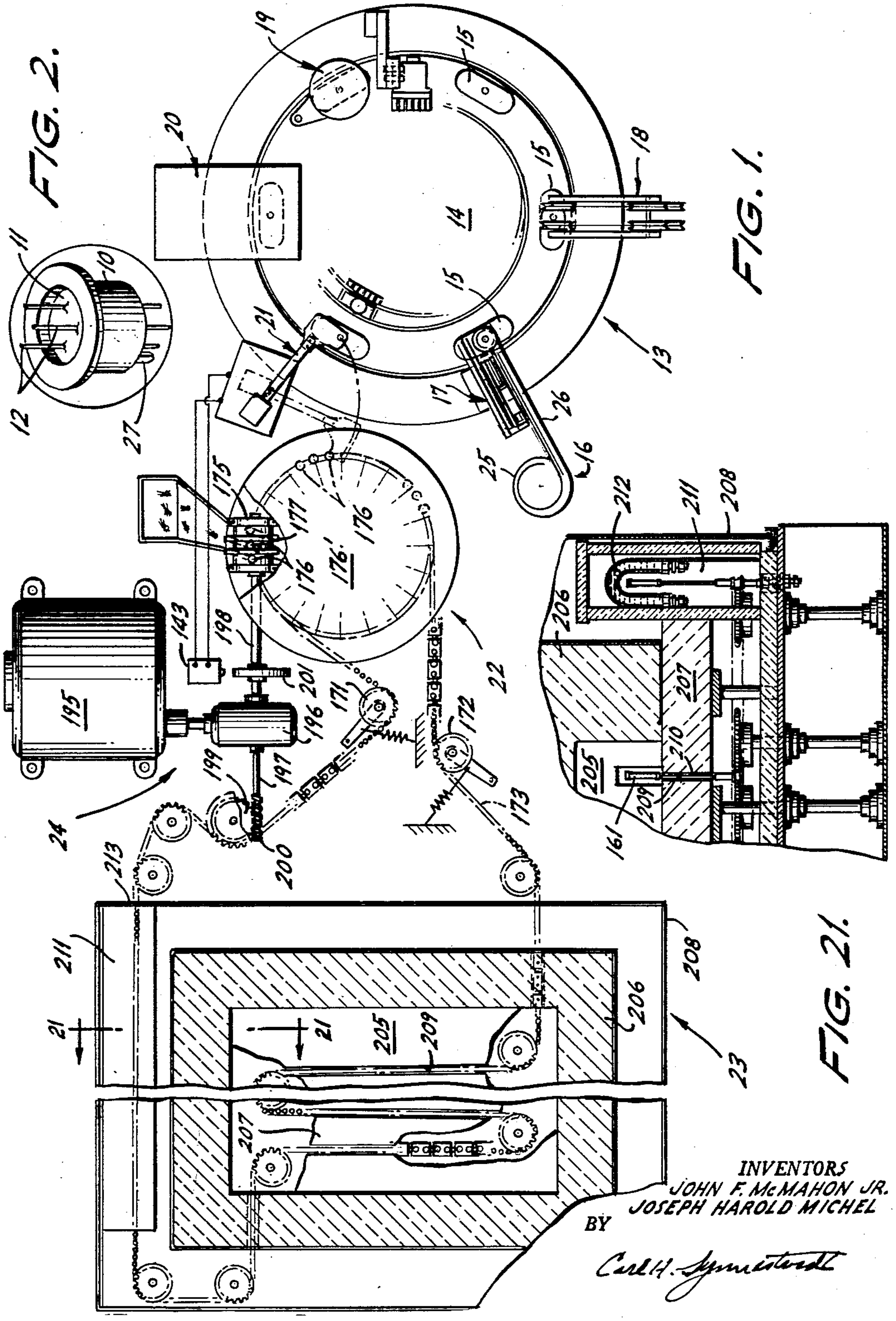
FIGURE 1 is a schematic plan view of one embodiment of the invention depicting a preferred form and arrangement of closure fabricating apparatus.
FIGURE 2 is an enlarged perspective of one type of closure device capable of automatic manufacture by the illustrated apparatus.
Figures 3, 4, 5:
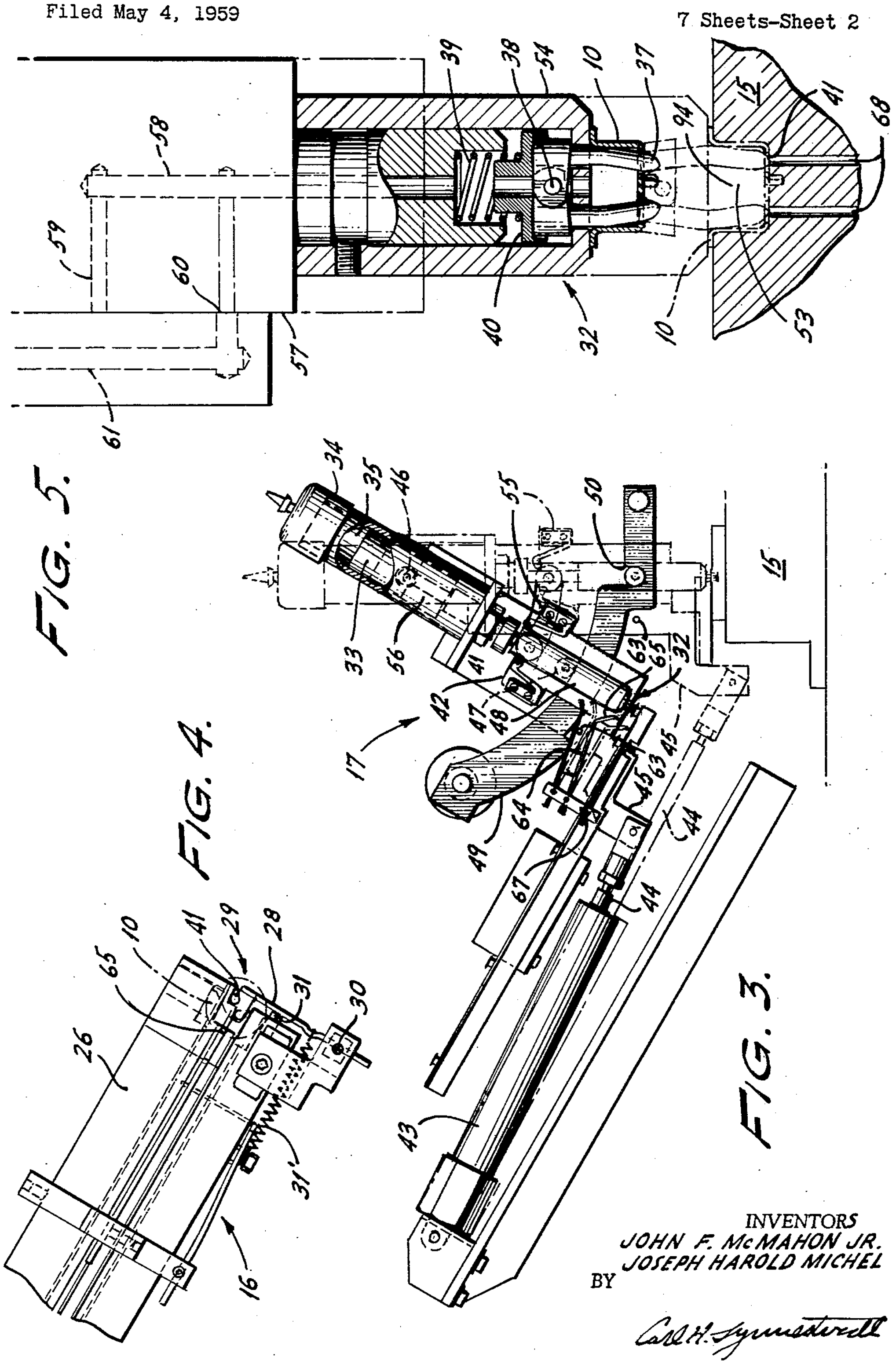
Figures 6, 7, 8:
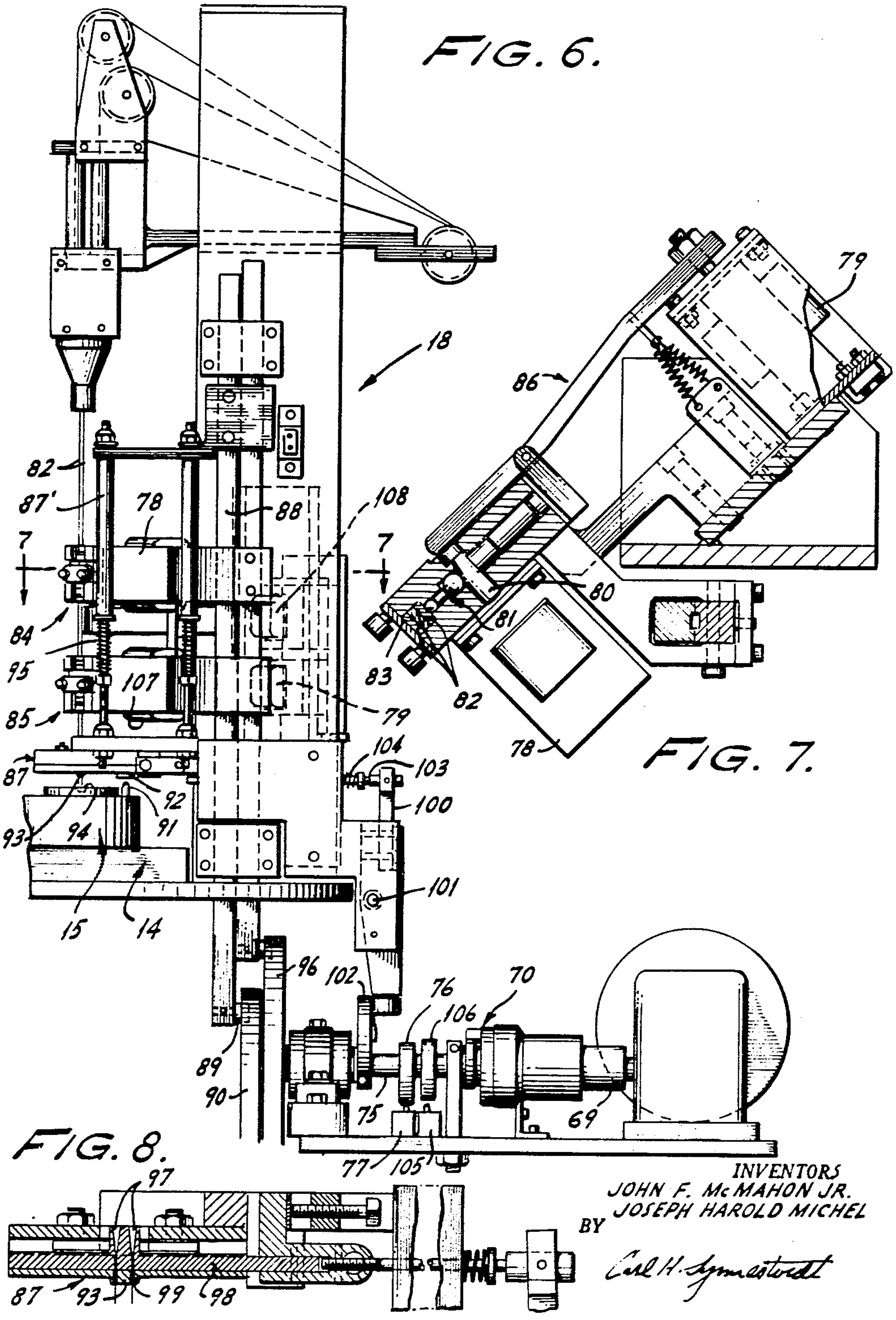
Figures 9, 10:
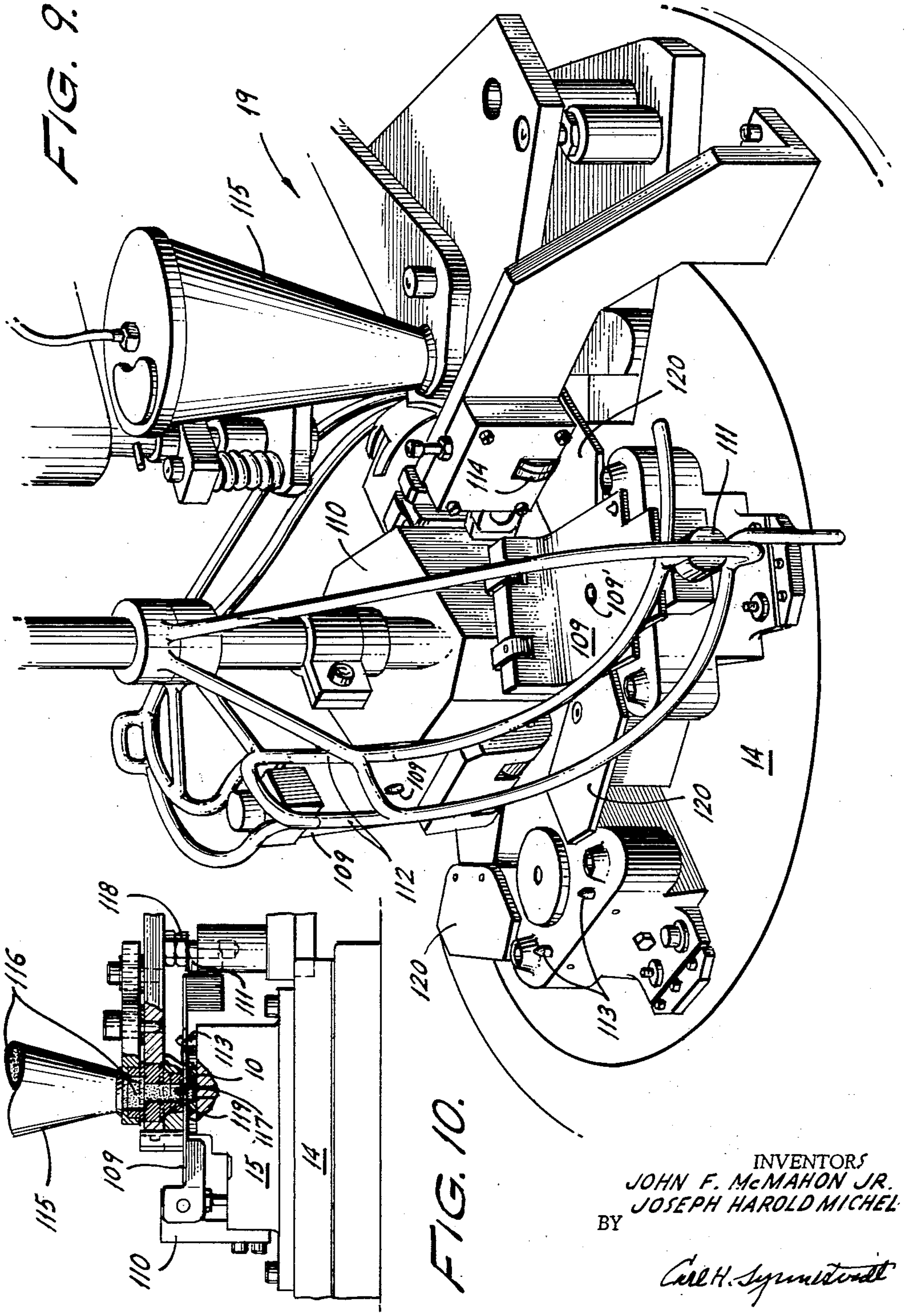
Figures 11, 12:
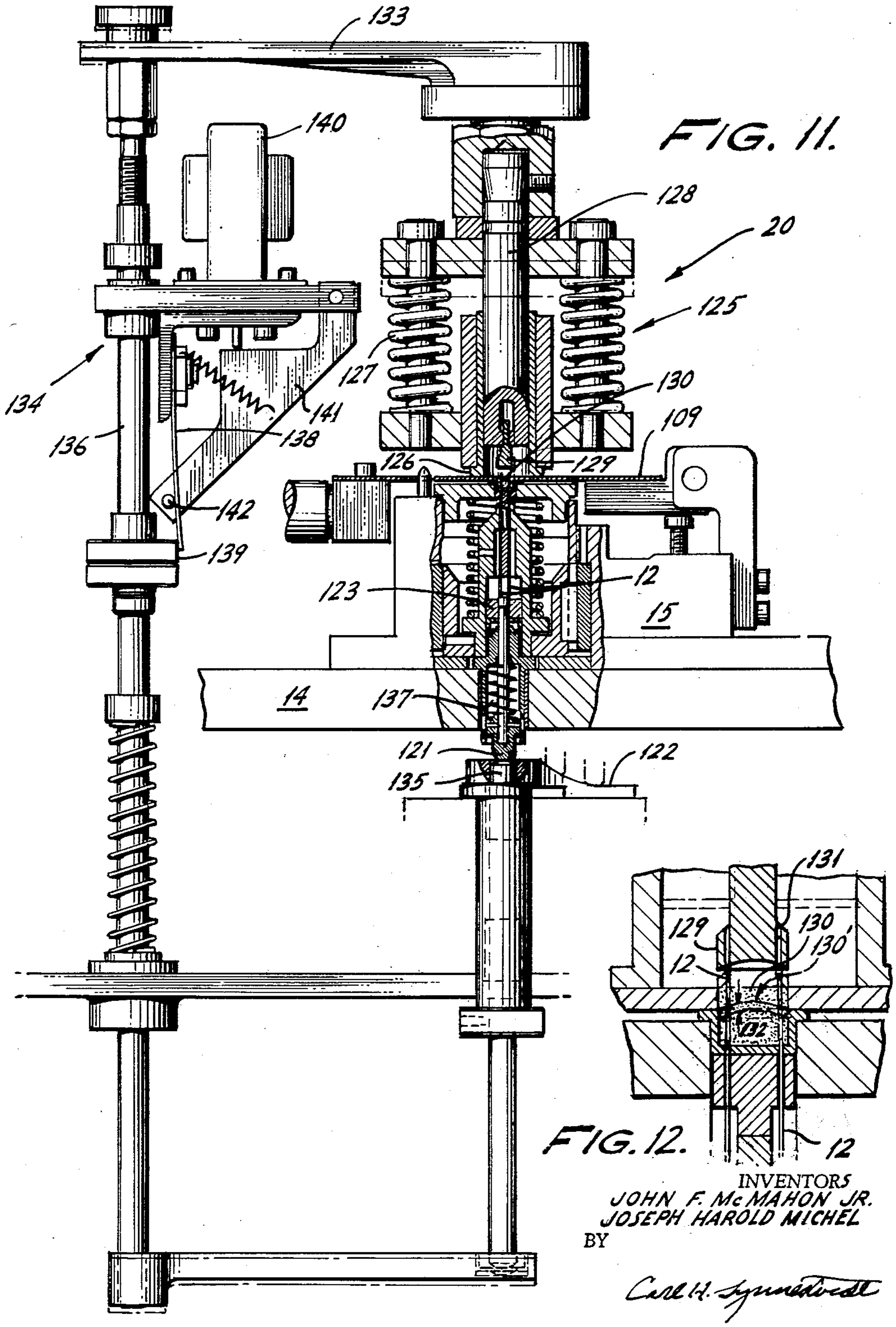
Figures 17, 18, 19, 20:
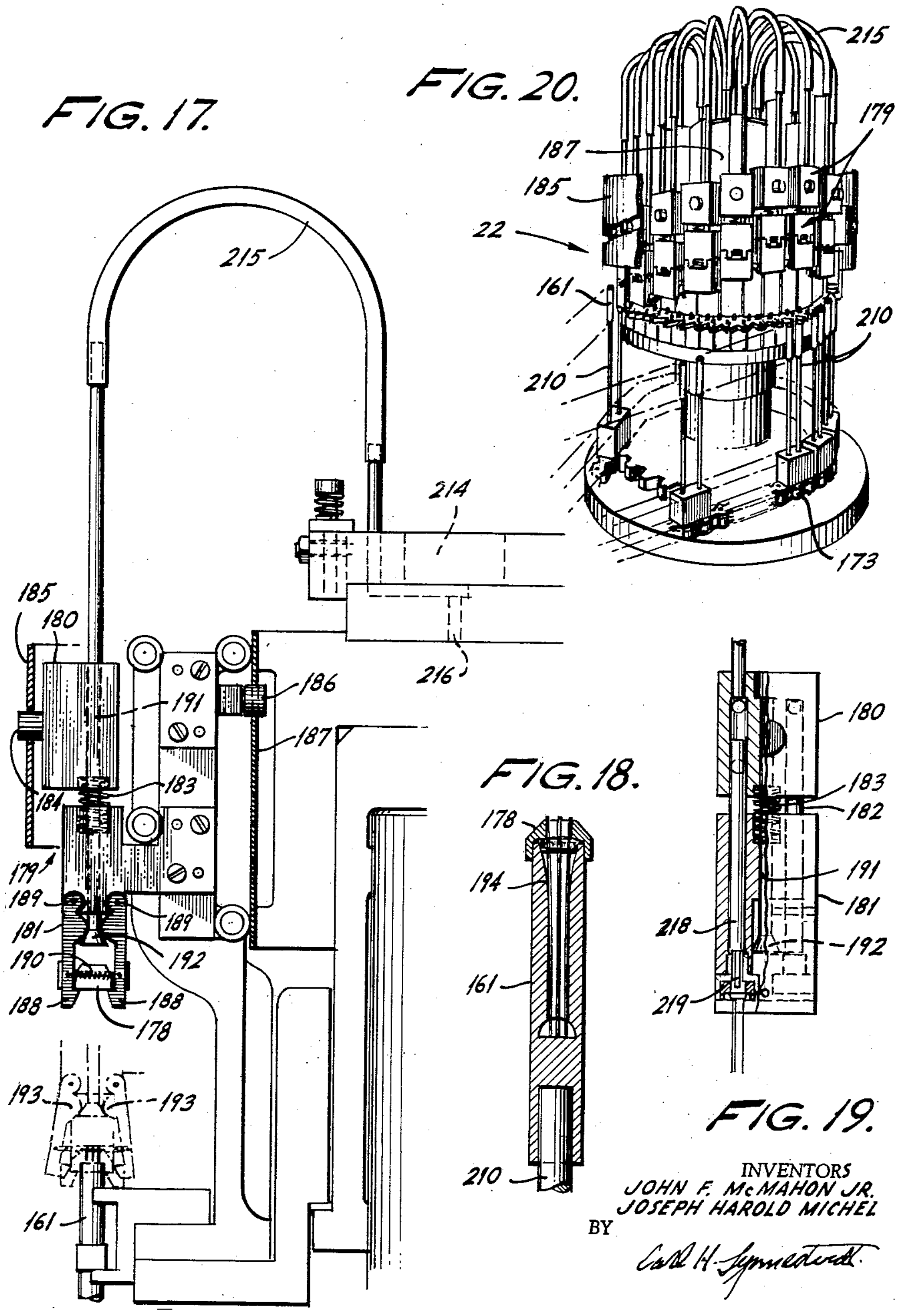

The figures which follow are detailed showings of the machine elements comprising the apparatus illustrated in FIGURE 1, in which:

FIGURE 3 is a front elevational view of eyelet positioning mechanism;

FIGURE 4 is a plan view of a terminal portion of track feed means adapted to supply oriented stem housings to the positioning mechanism shown in FIGURE 3;

FIGURE 5 is a greatly enlarged sectional view of a preferred form of pick-up mechanism;

FIGURE 6 is a side elevational view of the wire-feed machine;

FIGURE 7 is a detailed sectional view of wire gripping mechanism as viewed along the cutting plane 7—7 in FIGURE 6;

FIGURE 8 is a sectional view of the machine's wire severing means;

FIGURE 9 is a perspective view of the powdered-glass fill means and associated mechanism, certain machine elements having been deleted for clarity of illustration;

FIGURE 10 is a sectional elevation of the gravitational feed means shown in FIGURE 9;

FIGURE 11 illustrates the glass compacting assembly comprising press and associated sensing mechanism;

FIGURE 12 is an enlarged detailed showing of the compaction stroke of press operation;

FIGURES 13 through 16 show constructional details of the stem transfer mechanism;

FIGURE 17 is a perspective showing of the drum or chuck assembly into which stems are transferred preparatory to firing;

FIGURE 18 shows a stem assembly jigged for firing;

FIGURE 19 is a sectional showing of a drum carriage or jigging assembly;

FIGURE 20 illustrates a sectional side view of the carriage mechanism shown in FIGURE 19; and FIGURE 21 is a fragmentary sectional elevation of the annealing furnace shown in FIGURE 1.

As will now be understood, this invention relates to apparatus for automatically fabricating completed stem assemblies, as for example of the type shown in FIGURE 2, consisting of a metallic eyelet or ferrule 10 containing a vitrified glass core 11 traversed by a plurality of precisely aligned leads 12. The composite mechanism designed to produce this assembly is schematically illustrated in FIGURE 1 and consists of apparatus which can be described as an "automated array" of machines cumulatively functioning to produce a finished end product.

The apparatus can be divided into three distinct operational stages, the first or preliminary stage, designated generally by the number 13, consist of indexing feed mechanism including a rotationally translatable table 14 carrying a plurality of fixtures of dies 15 each suitably apertured to receive a stem housing, as for example the eyelet 10 shown in FIGURE 2. Arrayed around this table are a series of machines coordinately acting to produce a so called "green" or cold-pressed stem assembly comprising, in the preferred embodiment, the metallic eyelet 10, housing a core of pressed powdered glass traversed by a plurality of precisely aligned leads.

In greater detail this first stage consists of an eyelet orienting and feed device 16, an eyelet positioning or transfer device 17, lead insertion mechanism 18, powdered-glass filling means 19, press 20 and a stem transfer mechanism 21.

This complex of mechanism is followed by a second or intermediate stage into which the cold-pressed stems are transferred preparatory to firing and which consists of a drum or jigging assembly 22. This unit prepares the green stems received from stage one for annealing and effects their removal from the system after firing. The oven 23 constitutes the third and final stage of operation and it is here that the powdered glass core is vitrified and the hermetic bond between glass and metal perfected.

Coordination of machine effort is obtained by a flow of cascading impulses initiated on movement of the oven-feed drive mechanism 24. Operation of this drive energizes the transfer mechanism 21 which acts automatically to transfer pressed-glass stems to the drum assembly 22. This movement in turn relays an impulse to the press 20 initiating ram action which in turn actuates both the eyelet positioning device 17 and lead-insertion apparatus 18. On completion of ram operation each die is automatically indexed, by conventional means not shown, into the next work station, the operational sequence being repeated for each revolution of the drive mechanism.

The manufacturing process in essential part consists of automatically placing an array of precisely oriented leads in predetermined registration with a suitably oriented housing, filling the housing cavity, with leads in place, with powdered glass, compacting the glass into a self sustaining mass and firing the assembly to produce an integrated unit comprising a housing hermetically bonded to a vitrified core having sealed therein a plurality of precisely oriented leads.

The first step, referring to FIGURE 1, is to bulk feed eyelets into a vibrating hopper 25 where they are oriented by more or less conventional means and fed down track 26, eyelet orientation being maintained by track confinement of the eyelets' depending tab 27, seen most clearly in FIGURE 2. The oriented eyelets are brought to a stop at the end of this track by a positioning bar 28, shown in FIGURE 4, which terminates the track outlet 29. This bar pivots about pin 30 and is resiliently seated against the adjustable set screw 31 by spring 31'. By manual adjustment of this screw, eyelet positioning can be accurately regulated in relation to the pick up plunger 32, shown in FIGURE 3 and on an enlarged scale in FIGURE 5, carried by the transfer piston 33 of cylinder 34. This piston is normally held in the retracted position shown in solid lines in FIGURE 3, and is initially actuated, as previously noted, by an impulse triggered by movement of the press ram. Operation of the ram actuates a microswitch, not shown, which operates conventional valving controlling the flow of air to the upper chamber 35 of the double acting piston 33. This results in extension of the can pick up assembly 32 into engagement with an eyelet 10 accurately positioned at the end of track 26. Referring to FIGURE 5, can pick up is accomplished by means of depending fingers 37 projecting from the pick up plunger 32. These fingers are journalled on a pin 38 and are inwardly urged by spring 39 acting against collar 40. The lead holes 41 which are provided in the bottom of eyelet 10 are spaced at a distance somewhat greater than the centerline distance of the pick up fingers 37 with the result that movement of these fingers into the holes cams the fingers outwardly against the pressure of spring 39, the crooked shape of the fingers serving to impale the eyelet once the tips of the fingers pass through the holes and assume their normal rest position. A microswitch 42 is positioned to sense the location of the pick up plunger 32, so that when the fingers have pierced the eyelet lead holes valving is actuated energizing the traversing cylinder 43. The piston rod 44 powered by this double acting cylinder is pivotally secured at its outer end to the sector 45. This sector carries the pick up actuating cylinder 34 and its associated mechanism, the entire assembly being pivotally journalled on pin 46.

As the fingers 37 ensnare the eyelet, the roller 47, mounted on piston rod 48, comes into contact with the upper surface of the cam track 49 resisting further downward movement of piston 33. This track serves to define the path of motion executed by the pick up assembly as it is moved toward the indexing table by the traversing cylinder 43. The end of the cam track is provided with a detent 50 which registers with a die 15 carried by the rotary indexing table 14. As the roller 47 rides over the leading edge of this detent the remaining portion of the stroke of piston 33 is completed. The eyelet carried on the pick up fingers is plunged into the die aperture 53 (FIGURE 5) the impact of the fingers on the floor of the die driving the fingers 37 back into the retaining collar 54 compressing spring 39 releasing the eyelet. As the piston bottoms, a microswitch, not shown, is actuated operating valving causing air to flow into the lower chamber 56 of the pick up actuating cylinder causing immediate withdrawal of the pick up assembly. This withdrawal is so rapid that a partial vacuum is formed above the eyelet tending to unseat it. To prevent dislodgement caused by this rapid retraction, sleeve 57 is provided with bores 58 and 59. The construction is such that the air outlet port 60 of a continuously pressurized air line 61 is closed by exterior surface portions of the sleeve 57 except for the instant of time when the pick up assembly 32 is in its seated position within the die aperture 53, at which time the air outlet port 60 is placed in communication with the internal porting of sleeve 57 resulting in a blast of air being directed against the eyelet at the instant of cylinder withdrawal, breaking the vacuum and preventing dislodgement of the eyelet.

When the piston 33 reaches its fully withdrawn position microswitch 55 is actuated effecting return of the pick up assembly to its initial position shown in solid lines in FIGURE 3. As the sector 45 is pulled back into its starting position a pin 63 projecting from the face of the sector engages carriage 64 lifting the dependent crooked finger 65 out of the feed track 26 releasing the next succeeding eyelet into transfer position. The carriage pivots about pin 67 and is so counterbalanced that when released by withdrawal of pin 63 the finger drops in time to catch the immediately preceding eyelet preventing its escape on opening of the gate 28 by the pick up plunger as it starts its arcuate traverse thus providing controlled release of a single eyelet on each return of the pick up mechanism into starting position.

After placement of an oriented eyelet into the die aperture 53 the index table is advanced carrying the die-housed eyelet into registration with the wire-fed mechanism 18 shown schematically in FIGURE 1 and in detail in FIGURES 6 through 8. This assembly is designed to automatically feed wire of predetermined length into apertures 68 provided in each of the dies (see FIGURE 5). The apertures serve to maintain the leads in proper registration with the seated eyelet during the initial stages of stem fabrication.

The wire-feed mechanism shown in side elevation in FIGURE 6 derives its motive power from a continuously driven stud shaft 69 which is coupled thereto by a single revolution clutch 70. The wire feed mechanism, as was the eyelet positioning mechanism 17, is actuated by movement of the press ram. As the ram begins its stroke it actuates a microswitch, not shown, energizing this clutch mechanism coupling power to the drive shaft 75 for a single cycle of operation. Shaft 75 mounts a plurality of cams which serve to control the various phases of machine operation. Cam 76 initiates operation by tripping microswitch 77 which action simultaneously energizes solenoids 78 and 79 (see FIGURE 7). Solenoid 78 drives a tapered pin 80 into engagement with the ball and cylinder linkage 81 wedging the reel-fed wires 82 between the transversely running rods 83 of the upper jaw assembly 84. Concurrently, solenoid 79, acting on the lower jaw through linkage 86 hammers a tapered pin identical to that shown for the upper jaw out of locking position. This sequence of operations is followed by movement of the shear plate assembly 87 (FIGURES 6 and 8) into abutment with the upper surface of die 15. The shear plate is secured through spring loaded stanchions 87' to the reciprocable rod 88 the end of which carries a roller 89 contained within a closed cam track cut in the face of the eccentric 90. Movement of the assembly is produced on rotation of this eccentric by drive shaft 75. Alignment of the die and shear plate is accomplished through mating of the tapered pin 91 with bushing 92 insuring accurate seating of the wire positioning boss 93 within the eyelet cavity 94, the assembly being held in pressure bearing relation with the die face by means of springs 95.

With the plate properly positioned against the die face and the wires locked, the upper jaw 84 is advanced by cam 96, carrying the wires into the funnel-like apertures 97 provided within the shear plate 98 (see FIGURE 8), through the aligning apertures 99 provided in boss 93 seating the wires within die 15. At the termination of wire feed, arm 100, fulcrumed at 101, is rocked by cam 102 bringing the hammer 103 carried thereby against the spring biased pin 104 driving the shear plate 98, slidably housed within the cut-off assembly, against the lead-in wires, severing them. Immediately prior to lead severance, microswitch 105, actuated by cam 106, energizes solenoids 107 and 108. These solenoids serve respectively to lock the wires in lower jaw 85, in the same manner as previously discussed, while concurrently releasing the wire passing through the upper jaw 84. With the wires held in the lower jaws the leads are severed and the upper jaw 84 returned to its initial position by cam 96, the jaw sliding along the rigidly anchored wires. The severed ends of the wires are retained within the funnel like apertures 97 in order to facilitate the subsequent injection of wire into the next succeeding die.

After lead placement, the eyelet, with leads inserted is charged with powdered glass. The volume of glass disposed within the eyelet housing is particularly critical in the semiconductor field because of the extremely small sizes involved. Specifically, too much glass results in its overflow, during sealing, onto the peripheral flange of the eyelet thereby preventing subsequent hermetic closure with the encapsulating envelope, or alternatively, if too little glass is used, there is inadequate mechanical strength resulting in a defective seal. Details of the powdered glass technique as applied to the fabrication of semiconductor devices may be found in the copending application of Henry P. Beerman et al., Serial No. 654,907, assigned to the assignee of the present invention, now abandoned.

After deposit of the required volume of powdered glass within the eyelet cavity, the glass is compacted to produce mechanical integration of the particles. This results in sufficiently intimate contact between the leads and core material to effect, on subsequent heating, their hermetic juncture, and alternatively or conjointly, a self-supporting assembly capable of being freely handled during the following stages of fabrication without dislodgement of the constituent parts.

Because of the pronounced reduction in volume resulting from compaction of the powdered glass, the initial powdered charge occupies a much greater volume than that provided solely by the eyelet housing. Accordingly, the glass-fill station 19 shown in FIGURE 1 includes an apertured fill plate 109, shown in FIGURES 9 and 10 to provide the additionally required charging capacity. This plate is hinged along its inner edge to a centrally disposed member 110 and its outer edge carries a roller 111 mounted for engagement with a closed cam track 112. Each die has its own individual fill plate which is carried by the rotary table and dropped by the cam track onto the die as the die approaches the glass-fill station 19. The aperture 109' within the plate is registered with the die housed eyelet by means of orienting pins 113. To insure positive seating of the fill plate the assembly is passed under a pressure roller 114 prior to filling. This roller performs two essential functions, it presses the fill plate tightly against the flange of the eyelet, insuring a closed inner wall surface conjointly defined by eyelet and fill plate to prevent the escape of powdered glass during subsequent glass compaction, and secondly, it insures that the leads 12 are below the upper surface of the fill plate before the assembly passes under the glass-filled hopper 115, preventing lead damage. Powdered glass 116, shown in FIGURE 10, gravitates from the conical-shaped hopper 115 to the cavity delineated by the eyelet and fill plate aperture as the hopper outlet 117 and cavity come into registration. The vertical height of the hopper is adjustable by means of lock nuts 118 in order to accommodate any required variation in charge. To prevent leakage of glass from the hopper during fill, an O ring 119 is provided, forming a glass-tight seal against the upper surface of the fill plate. As the indexing table is transfered out of the fill station it produces a wiping action between the lower surface of the hopper and the upper surface of the fill plate insuring the deposit of a precisely measured amount of powdered glass. As shown in FIGURE 9 the fill plates 109 are dropped between elevated platform 120 carried by the indexing table, these platforms together with the fill plates forming a substantially continuous surface stopping off the flow of glass between filling operations.

The next phase of fabrication consists of compacting the powdered glass into the eyelet 10. As the indexing table carries the glass-filled assembly out of the glass fill station and into registration with the press 20, the detailed construction of which is shown in FIGURE 11, the spring biased shoe 121 resiliently suspended from the die 15 rides up the inclined ramp 122 in the manner indicated in phantom in FIGURE 11 bringing the case hardened anvil 123 attached thereto into engagement with the lower ends of leads 12 raising them from their depressed position, required for glass fill, to the elevation desired. When the die is in registration with the press the compression stroke of the ram is initiated. The first portion of the stroke of the ram head 125 carries the collar 126 slidably mounted thereon into pressure bearing relation with the upper surface of fill plate 109, the springs 127 maintaining the collar 126 snugly against the plate during the compression phase of ram travel.

As the ram 128 continues its descent the forming tool 129 carried thereby moves into contact with the stack of powdered glass 130 (FIGURE 12) contained within the cavity conjointly defined by eyelet and fill plate, pressing it down into the eyelet in the manner shown in FIGURE 12. The tool 129 is apertured at 131 to pass the leads 12 during glass compaction and its lower face is provided with a centrally located depression to impart a convex contour 130' to the glass core to prevent excessive wetting of the eyelet flange area during subsequent firing. The ram is set for pressure reversal by conventional means not shown so that immediately the desired degree of glass compaction is attained the ram is automatically returned to its starting position.

As the ram approaches the end of its compression stroke the increasing frictional drag exerted by the compacted glass against the leads carries them along with the glass during the final phases of ram movement. This critical increment of movement is graphically shown in FIGURE 12, and denominated 132. To prevent distortion of the leads during this portion of the compression stroke the anvil 123 is partially retracted by means of the ram actuated linkage 134. Anvil withdrawal is accomplished by means of a pin 135 carried by this linkage which forms the terminal portion of ramp 122 against which the shoe 121 rides on indexing of the die into the press station. At the critical point of ram movement rod 136 is pushed down by the press attachment 133. This withdraws pin 135 resulting in retraction of the anvil 123 by spring 137. To prevent return of the anvil until after the eyelet is transferred out of the pressing station a leaf spring 138 is positioned to drop into locking position behind an adjustable retaining collar 139 carried by rod 136. Transfer of the eyelet out of the press station effects energization of solenoid 140, the armature of which acts on lever 141 carrying pin 142. This dislodges the leaf spring and permits return of pin 131 to its original position within the ramp 122.

The eyelet 10 is preferably drawn from 10 mil copper stock and has an inside diameter of approximately 150 mils. It has been found that a force of about 3000 lbs. exerted on the powdered glass core through the intermediation of the ram, produces sufficient mechanical integration of the granulated glass particles to retain the leads in requisite orientation during subsequent phases of fabrication and insures sufficiently intimate contact between the component parts of the stem to produce an acceptable hermetic seal on subsequent firing. Moreover, this pressure-induced mechanical integration of particles serves to lock the fusible core material within the eyelet in such manner that the assembly comprising eyelet and compacted core, when removed from the retaining mold presents a self-sustaining, integrated structure.

At this stage of fabrication the assembly, termed a "green" or cold-pressed stem, is indexed into the succeeding station where the transfer mechanism, shown schematically at 21 in FIGURE 1, and in detail in FIGURES 13 through 16, transfers the pressed glass unit into a firing fixture preparatory to firing.

Figures 13, 14, 15, 16:
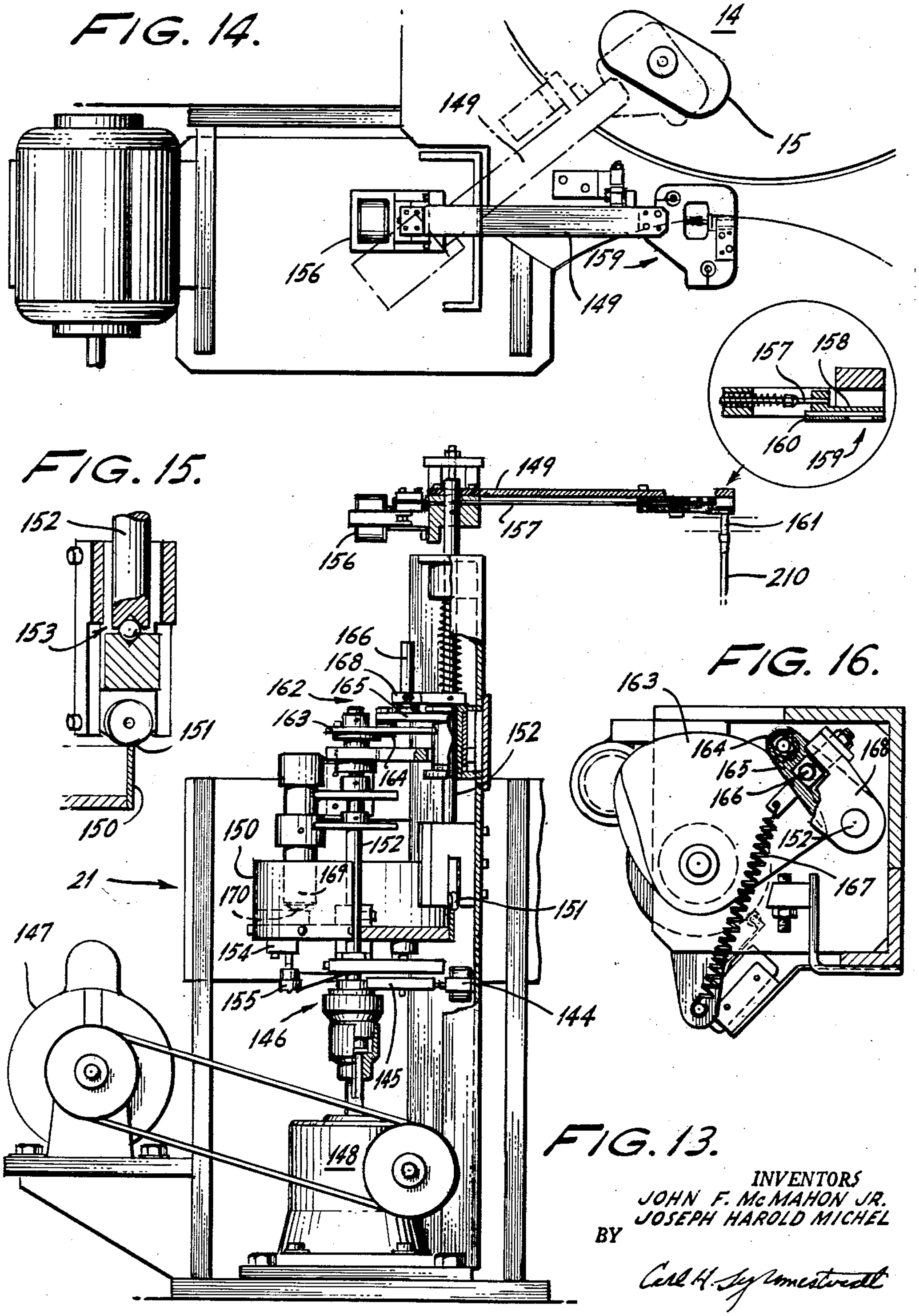

On receipt of a signal from microswitch 143 (see FIGURE 1) triggered by movement of the drive mechanism 24, solenoid 144 shown in FIGURE 13 is energized withdrawing the clutch dog 145 actuating the single revolution clutch 146.

The driving member of this clutch is maintained in continuous operation and is driven by motor 147 acting through the speed reducer 148. The transfer arm of this mechanism is initially in the position shown in phantom in FIGURE 14, the transfer arm 149 hovering directly above the transfer station of the index table. Vertical movement of this arm is produced through the interaction of drum cam 150 and follower 151. To permit relative rotation between the transfer arm actuating rod 152 and cam follower 151, a ball bearing coupling 153 is interposed between the members, the detailed construction being shown in FIGURE 15. The cam 150 is in the shape of a hollow cylinder, the walls of which have a generally sinusoidal configuration, the top surface forming the driving element of the cam. Appended to the floor of this can is an additional cam-like member 154 designed intermittently to energize the microswitch 155 associated therewith. This switch operates solenoid 156 mounted to arm 149. Energization of this solenoid acting through rod 157 retracts the spring-biased gripper plate 158, slidably mounted, within the jaw 159. This action aligns an array of holes provided in plate 158 with a similar arrangement of holes contained in a lower stationary plate 160. With the two plates comprising the gripping jaw thus aligned the arm is lowered, seating the apertures over the top of stem leads 12. The solenoid is then deenergized and the upper plate is spring returned to its original offset position locking the leads against the lower stationary member. With the leads secured, the arm is elevated withdrawing the stem from the die.

Horizontal traverse of the arm, necessary to transport the eyelet to the firing fixtures 161, shown in FIGURE 20, is accomplished by means of the cam-follower assembly 162. The cam 163 of this assembly, seen most clearly in FIGURE 16, is roughly heart-shaped and acts on the roller 164 mounted on lever 165. This lever mounts an outboard key or rod 166 and is urged, by spring 167, into pressure bearing relation with the cam 163. The outboard key is journalled within an assembly carried by arm 168 which are is fixedly secured to rod 152 for pivotal movement therewith. Key 166 thus controls the horizontal traverse of arm 149 while permitting independent vertical movement of rod 152. This enables the correlative functioning of cams 150 and 163 to provide the required composite movement of arm 149. By this dual cam action the arm 149 transports the stem by its leads, depositing the assembly in the firing fixture 161. When the stem is located within the firing fixture microswitch 155 is again actuated by cam 154 energizing solenoid 156 which pulls plate 158 back releasing the stem leads from the gripping jaw. The arm is then cam returned to its starting position to repeat the cycle of operation.

The weight of the rod 152 and its associated mechanism acting on the inclined surface of the cam 150 produces a horizontal thrust component which if not resisted induces torsional whip of the cam preventing precise control of transfer movement. To prevent this distortion of movement a braking device is provided in the form of a spring biased ball bearing mount 169, the ball 170 being maintained in frictional engagement with an inner surface of the drum during critical phases of cam movement. After transfer of stems into the firing fixtures 161, the stems are automatically prepared for firing by means of the jigging fixtures or drum assembly 22.

To insure maintenance of lead orientation during firing it is necessary that the stems be transported through the oven with minimal disturbance, any vibration or jerking movement disturbing lead orientation, and in extreme cases causing wetting of the eyelet flange and firing jig. At the same time it is necessary to provide for intermittent movement of the chuck or drum assembly 22, perspectively illustrated in FIGURE 20, to accommodate the transfer of stems. To produce these distinct types of movement utilizing a single continuous chain drive, in order to obtain perfect synchronism, we have devised the novel arrangement shown in FIGURE 1. Idlers 171 and 172 are incorporated to respond to the changing tension of the chain resulting from the drum's intermittent movement, each idler automatically compensating for the changing chain tension. By this technique synchronization of movement is insured between the drum, oven and transfer mechanism and there is provided a continuous, uniform flow of stems into and through the annealing furnace.

The prime mover which powers both the drum assembly and oven feed chain transport 173 carrying the firing fixtures is schematically shown in FIGURE 1 and comprises a variable speed motor 195 acting through a gear box 196 provided with dual output shafts 197 and 198. Shaft 197 powers the drive sheave 199 through worm 200 while shaft 198 carries the drum drive cam 175. Mounted to the drive shaft 198 is a cam 201 which operates the microswitch 143 activating the transfer mechanism clutch solenoid 144. This initiates transfer of cold pressed stems to the firing fixtures 161 in the manner previously described.

The jigging assembly 22 is driven by the continuously rotating drive cam 175 acting on a plurality of circumferentially spaced rollers 176 carried by the drum table 176'. Intermittent rotational movement of the drum is accomplished by means of a helical screw drive 177 provided along 180° of cam rotation followed by a dwell period of 180°.

Transfer of stems to the firing fixtures 161 carried by the chain transport 173 takes place during this period of dwell. This step is followed by placement of a firing jig or cap 178, see FIGURE 18, onto the fixture mounted stem assembly in order to insure maintenance of the requisite orientation of stem leads during firing, this operation taking place at the drum assembly 22 the constructional features of which are shown in FIGURES 17 through 20. These jigs are placed onto the firing fixtures by carriages 179 mounted for rotation around the periphery of the drum and are brought into operative position by rotation of the drum table. Each carriage is comprised of two relatively movable sections 180 and 181, the upper section 180 being slidably mounted on rods 182 and resiliently suspended above the lower section 181 by a recessed spring 183 as shown in FIGURES 17 and 19. Both these sections are separately cam operated, the upper section carrying a roller 184 controlled by the closed cam track of an external fixed drum cam 185 while movement of the lower section is regulated by the interaction of its roller 186 with a fixedly mounted internal drum cam 187. The spring 183 accommodates relative movement between the two sections when the two cam paths deviate.

The lower portion of the carriage is provided with a set of jaw plates 188 mounted for pivotal movement about pins 189, the jaws being biased into closed position by spring 190.

As the firing jig 178 is deposited over the stem assembly onto the firing fixture 161 in the manner graphically illustrated in FIGURE 17, the top section of the carriage is displaced upwardly carrying with it the valve-like rod 191. The lower portion 192 of this rod is cone shaped so that on upward movement thereof it cams the jaws 188 open by engaging the contoured surfaces 193 provided on each of the jaw faces, freeing the carriage-housed firing jig 178 and permiting its deposit onto the stem carrying firing fixture 161.

The firing jig, shown in FIGURE 18, is centrally apertured and is designed to constrain the leads against outward movement during firing. The lower portion of the leads are similarly confined within a reduced cross sectional portion 194 of the firing fixture so that the leads are outwardly tensioned to seat against the bounding upper ring of the firing jig on liquification of the powdered glass. It has been found that the principle source of lead misalignment derives from surface tension of the liquified glass matrix which exerts an outwardly directed radial thrust against the leads. By simply providing radial restraint in the manner shown, lead orientation is maintained during this critical period of stem fabrication.

To obtain a hermetic seal between the leads, eyelet and glass matrix, the copper parts are pre-treated in accordance with the method of producing glass-to-copper seals described in the copending application of Anthony J. Certa bearing Serial No. 760,454, filed September 11, 1958, now Patent No. 3,069,871, and assigned to the assignee of the present invention. This method comprises oxidizing surface portions of the copper to the cupric state under conditions of time and temperature preventing copper recrystallization, and by chemical treatment by any of a number of commercially available formulations. The sheet of cupric oxide thus formed provides the necessary bonding bridge between the glass matrix and copper substrate without impairing the strength properties of the copper. Accordingly, the work piece may undergo normal handling after oxidation, as in the press operation, without fear of deformation. Following this low temperature oxidation, the glass to copper seal may be made by simply bringing the glassing media into intimate contact with the oxidized surface of the copper and then heating the assembly to a temperature sufficient to effect hermetic juncture. This method of treating copper makes possible the use of a glass compacting technique which is essential to the efficient mass production of stem closures. The oxide initially formed undergoes subsequent conversion during sealing to provide a tight adherent bond between the copper and sealing media.

The cold pressed stems, after confinement of the leads by the firing jig are transported by the feed chain 173 into the annealing furnace or oven 23.

The oven contains two separate chambers as seen in FIGURE 1 with the top removed and in elevational section in FIGURE 21, the first or sealing chamber 205 is centrally disposed and is constructed of a bell portion 206, firmly seated against a raised inner floor 207 of refractory material positioned within the oven housing 208. The floor of this chamber is provided with a sinuous passageway 209 through which the support rods 210 carrying the firing fixtures 161 extend. This chamber is maintained at sealing temperature, a representative temperature, for example, when using a potash, soda lead glass being in the approximate range of 800–850° C. To prevent deterioration and attendant degradation of the exposed surfaces of the copper stems and leads resulting from too rapid oxidation at this elevated temperature, the seal is perfected in a nitrogen enriched atmosphere. The resultant reduction in available oxygen inhibits surface oxidation and additionally provides for an improved seal through prevention of interfacial oxidation between the copper oxide bonding sheath and the molten glass matrix.

The smooth uninterrupted movement of the stems through the firing chamber, as provided for by the unique drive system described above, insures minimal disturbance of the leads during this critical phase of fabrication.

On completion of the vitrifying phase of annealing, the stems are transported from this inner sealing zone to an exit corridor 211 maintained in heat transfer relation with a water cooled jacket 212. The stem and support structure are here cooled to a temperature of about 300° C. before being passed through the exit port 213.

The completed stem assembly after firing is transported from the oven back into registration with the drum mechanism 22 where the firing jigs are removed and the completed stem extracted from the firing fixture. Removal of the firing jig is accomplished by positioning the drum carriage, with the jaws 188 open, over the firing jig, closing the jaws and withdrawing the jig, the operation of the mechanism being the inverse of that discussed previously. At the same time that the carriage is brought into registration with the firing fixture, the rotary slide valve 214 (see FIGURE 17) places the tubing 215 associated with that particular carriage in communication with a vacuum port 216. This lifts the stem into the carriage, seating the stem against the carriage-housed firing jig. The carriage is then lifted clear of the firing fixture and the vacuum maintained until the carriage reaches the stem discharge station where the completed stem assembly is ejected onto a discharge ramp 217, schematically shown in FIGURE 1. After sealing, the stem sometimes sticks to the firing jig. To insure positive ejection the upper section of the carriage carries a rod 218, shown in FIGURE 19, which bears an axially disposed knockout pin 219. The pin is moved into engagement with the stem at the instant the vacuum is broken, mechanically urging the stem from the firing jig. The firing jigs are retained by the carriage for redeposit onto the next batch of cold-pressed stems transferred from the rotary feed table 14.

The above-described integrated mechanism provides automatic, high speed production of hermetic closures, the machine illustrated being capable of producing units of the type illustrated at a very high rate, for example about 1100 per hour. Moreover, this gain in productivity is accompanied by increased unit reliability and reduced cost.

While a preferred form of the present invention has been depicted and described, it will be understood by those skilled in the art that the invention is susceptible of changes and modifications without departing from the essential concepts thereof, and that such changes and modifications are contemplated as come within the terms of the appended claims.

We claim:

1. In apparatus for automatically fabricating hermetic stems of the type having a metallic housing bounding a glass core traversed by at least one lead-in wire, the combination comprising: indexing feed mechanism including translatable means mounting a plurality of dies each apertured to receive a stem housing and leads, and said mechanism being adapted to carry die-mounted housings sequentially into successive registration with a progression of machine elements synchronized for coordinate action, said machine elements comprising: means for depositing housings within said dies; wire-feed means for disposing a predetermined length of wire within the die-mounted housings; means for gravitationally supplying a predetermined charge of powdered glass to the housing cavities; means for compacting said charge into an integrated mass capable of self-maintaining its compacted configuration within said housings; stem-transport means comprising a chain of firing fixtures constructed to receive cold-pressed stem assemblies; transfer means for translating the cold-pressed stem assemblies from said feed mechanism to said firing fixtures; means for coordinating the movements of said transfer means and indexing feed mechanism; an oven for heating the cold-pressed stem assemblies to a temperature sufficient to fuse component parts of such an assembly into a hermetically integrated unit; and stem-transport drive means adapted to provide continuous uninterrupted movement of certain of said fixtures through said oven while concurrently providing for intermittent movement of others of said fixtures to accommodate intermittent transfer of said cold-pressed stem assemblies, by said transfer means, to said fixtures.

2. In apparatus for automatically fabricating hermetic stems of the type having a metallic housing bounding a glass core traversed by at least one lead-in wire, the combination comprising: indexing feed mechanism including a rotary table mounting a plurality of dies apertured to receive a stem housing and leads, said mechanism being adapted to carry die-mounted housings sequentially into successive registration with a progression of machine elements synchronized for coordinate action, said machine elements comprising: means for depositing housings within said dies; wire-feed means for disposing leads within said die-mounted housings; means for gravitationally supplying a predetermined charge of powdered glass to the housing cavities; means for compacting each charge into an integrated mass capable of self-maintaining its compacted configuration within said housing; stem-transport means comprising a chain of fixtures constructed for receipt of cold-pressed stem assemblies; means for jigging the leads of said cold-pressed stem assemblies preparatory prior to vitrification of said charge, including means interconnected with a section of said chain of fixtures to insure synchronous movement between said fixtures and the jigging means; means for transferring said cold-pressed stem assemblies from said indexing feed mechanism to said fixtures; means insuring synchronized movement between said transfer means and said indexing feed mechanism; an oven for firing cold-pressed stem assemblies to a temperature sufficient to produce a hermetically integrated unit; stem-transport drive means comprising a variable speed motor drivingly coupled to a pair of output shafts one of which powers said chain, to provide continuous uninterrupted movement of a section thereof and of fixtures carried thereby through said oven, and the other of which shafts is coupled to said jigging means to provide intermittent movement thereof and of said section of chain of fixtures carried thereby, whereby to accommodate intermittent transfer of said cold-pressed stem assemblies to said fixtures; and means for automatically compensating for changes in the tensional stress of said chain of fixtures resulting from differential movement of sections thereof.

References Cited in the file of this patent

UNITED STATES PATENTS

| | | |
|---|---|---|
| 1,813,565 | Conn | July 7, 1931 |
| 2,253,155 | Wadman et al. | Aug. 19, 1941 |
| 2,347,421 | Little | Apr. 25, 1944 |
| 2,444,518 | Lewis | July 6, 1948 |
| 2,489,921 | Moore | Nov. 29, 1949 |
| 2,523,903 | Ellwood | Sept. 26, 1950 |
| 2,697,307 | Diehl et al. | Dec. 21, 1954 |
| 2,717,417 | Rigsby | Sept. 13, 1955 |
| 2,725,680 | Baker | Dec. 6, 1955 |
| 2,829,782 | Roeber | Apr. 8, 1958 |
| 2,832,478 | Malewicz | Apr. 29, 1958 |
| 2,857,711 | Maurer | Oct. 28, 1958 |
| 2,932,920 | Peras | Apr. 19, 1960 |
| 2,950,574 | Slater et al. | Aug. 30, 1960 |